US 6,710,857 B2

(12) United States Patent
Kondo (10) Patent No.: US 6,710,857 B2
(45) Date of Patent: Mar. 23, 2004

(54) SUBSTRATE HOLDING APPARATUS AND EXPOSURE APPARATUS INCLUDING SUBSTRATE HOLDING APPARATUS

(75) Inventor: Makoto Kondo, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/803,920

(22) Filed: Mar. 13, 2001

(65) Prior Publication Data
US 2002/0008864 A1 Jan. 24, 2002

(30) Foreign Application Priority Data

Mar. 13, 2000 (JP) ....................................... 2000-069321
Mar. 6, 2001 (JP) ....................................... 2001-061769

(51) Int. Cl.⁷ .......................... G03B 27/58; G03B 27/62
(52) U.S. Cl. ............................................ 355/72; 355/75
(58) Field of Search ..................... 355/30, 53, 72–76; 310/10, 12; 378/34

(56) References Cited

U.S. PATENT DOCUMENTS

| | | | | |
|---|---|---|---|---|
| 4,503,335 A | * | 3/1985 | Takahashi | 250/548 |
| 4,666,291 A | * | 5/1987 | Taniguchi et al. | 355/52 |
| 4,737,824 A | * | 4/1988 | Sakai et al. | 355/53 |
| 5,191,218 A | * | 3/1993 | Mori et al. | 250/453.11 |
| 5,324,012 A | | 6/1994 | Aoyama et al. | 269/21 |
| 5,329,126 A | * | 7/1994 | Amemiya et al. | 250/453.11 |
| 6,072,163 A | * | 6/2000 | Armstrong et al. | 219/497 |

FOREIGN PATENT DOCUMENTS

| | | | |
|---|---|---|---|
| EP | 1059566 A2 | | 12/2000 |
| JP | 409295236 | * | 11/1987 |
| JP | A 1-129438 | | 5/1989 |
| JP | 405235060 A | * | 9/1993 |
| JP | B2-2574818 | | 10/1996 |
| JP | 2574818 | | 1/1997 |
| JP | B2-29991110 | | 10/1999 |
| JP | 29991110 B | | 12/1999 |

* cited by examiner

Primary Examiner—Henry Hung Nguyen
(74) Attorney, Agent, or Firm—Oliff & Berridge PLC

(57) ABSTRACT

A substrate holding apparatus which holds a flat-like substrate comprises a base member and a plurality of projecting support members disposed on the base member such that the supporting members are arranged like a triangular lattice and distal end portions thereof are positioned on substantially the same plane. The substrate is to be placed on the plurality of support members.

28 Claims, 7 Drawing Sheets

PRIOR ART

SUBSTRATE HOLDING APPARATUS AND EXPOSURE APPARATUS INCLUDING SUBSTRATE HOLDING APPARATUS

BACKGROUND OF THE INVENTION

1. Field of the Invention

The present invention relates to a substrate holding apparatus and an exposure apparatus including the substrate holding apparatus, and more particularly, to a substrate holding apparatus, which is used for holding a substrate when transferring a mask pattern onto the substrate in a lithography process for manufacturing devices such as a semiconductor device, a liquid crystal display device, a plasma display device and a thin film magnetic head, and to an exposure apparatus including the substrate holding apparatus.

2. Description of the Related Art

In the case of manufacturing a semiconductor device or the like, in order to transfer a reticule pattern image used as a mask to each shot area on a wafer (or a glass plate, etc.) which is used as a substrate onto which a resist is applied, a full field exposure type, such as a step-and-repeat type, exposure apparatus, and a scanning exposure type, such as a step-and-scan type, exposure apparatus are used. In the aforesaid exposure apparatuses, a wafer is held on a wafer holder by vacuum chucking, electrostatic chucking or/the like, and the wafer holder is fixed on a coarsely and finely movable wafer stage.

A conventional wafer holder includes, as disclosed, for example, in Japanese Unexamined Patent Application Publication No.1-129438, a large number of pins arranged like a square lattice, and a suction portion for sucking the gas from a suction hole between these pins. In a state in which the wafer is placed on the large number of pins, the gas between the wafer and the wafer holder is exhausted by the suction portion, and thereby, the wafer has been chucked and held. Moreover, in order to prevent the wafer from being electrically charged, the entire surface of the wafer holder is coated with a conductive material, and further, earth connection is carried out with respect to the back side of the wafer holder.

As described above, in the conventional wafer holder, the wafer is placed on the plurality of pins arranged, for example, like a square lattice, and the wafer is held by vacuum chucking or the like. However, a deformation (warp, etc.) is locally generated in the wafer by the vacuum chucking or the like. When the deformation is increased to a range of the depth of focus of a projection optical system, a resolution at that portion is lowered; for this reason, preferable exposure cannot be made locally in some shot areas on the wafer.

In order to suppress the above wafer deformation due to vacuum chucking or the like, there is a need of making fine intervals between pins arranged for supporting the wafer or weakening a suction force. However, when the suction force is simply weakened, there is a possibility such that a shift occurs in wafer alignment during acceleration period and deceleration period of step movement. On the other hand, when the intervals between the arranged pins are made fine, a contact rate of the wafer with the wafer holder increases, and there is a high possibility such that foreign matters are held between the back side of wafer and the wafer holder. For this reason, a problem arises such that a flatness of wafer is reduced.

Moreover, in the case where the wafer holder is formed of a material having a low coefficient of thermal expansion, when the surface of the wafer holder is coated with an anti-electrical charging material, an internal stress is generated due to a difference in the coefficients of thermal expansion between the anti-electrical charging material and the material forming the wafer holder. As a result, there is a possibility such that the anti-electrical charging material cracks and peels off. For this reason, it is difficult to thick coat the anti-charging material to the surface of the wafer holder. Therefore, after the surface of the wafer holder is coated with an anti-electronic charging material, in order to improve a flatness of the contact surface of the wafer holder with the wafer, it is difficult to carry out polishing and the like with respect to the contact surface (coating surface). As a result, a problem arises such that micro unevenness remains in the contact surface.

In addition, in a manufacture of semiconductor device or the like, an improvement of throughput has been demanded. However, in a conventional exposure apparatus, a wafer is first placed on a wafer bolder, and thereafter, the exhaust (suction) of the gas is started by a vacuum pump for chucking and holding the wafer. For this reason, it takes a long time until a force required for holding the wafer is increased up to a desired value. Further, in the case of carrying out the wafer from the wafer holder for wafer exchange, conventionally, a valve communicating with a gas having an atmospheric pressure is simply opened in the case of stopping the suction by the vacuum pump. For this reason, it takes a long time until the suction force of wafer is lost. Therefore, in the conventional wafer holder, it takes a time to load and unload the wafer; for this reason, this is a factor of faults in improvement of throughput of exposure process.

SUMMARY OF THE INVENTION

The present invention has been made in view of the above problems in the prior art. It is, therefore, a first object of the present invention to provide a substrate holding apparatus, which can reduce a deformation in the case of chucking a substrate such as a wafer with respect to a contact area of the substrate with the wafer holder.

Further, a second object of the present invention is to provide a substrate holding apparatus, which is constructed in a manner that an area including a contact surface with the substrate is coated with, for example, an anti-electronic charging material, and can prevent a crack and the like of the anti-electronic charging material.

Further, a third object of the present invention is to provide a substrate holding apparatus, which can carry out a substrate chucking start operation or substrate chucking release operation at a high speed so that throughput is improved.

Further, another object of the present invention is to provide an exposure apparatus including the aforesaid substrate holding apparatus.

According to a first aspect of the present invention, there is provided a substrate holding apparatus which holds a flat-like substrate, comprising:

a base member; and a plurality of projecting support members disposed on said base member such that the supporting members are arranged like a triangular lattice and distal end portions thereof are positioned on substantially the same plane, wherein the substrate is to be placed on the plurality of support members.

Like the substrate holding apparatus according to the first aspect of the present invention, in a case where the plurality of support members which are to contact the substrate are arranged like a triangular lattice, the following effect is obtained. More specifically, as compared with the case where these plural support members are arranged like a rectangular lattice, an interval between the plural support members and the position of the center of gravity is shortened with respect to a density of the support members (area contacting with the substrate), and a deformation of the substrate is reduced. Therefore, according to the first aspect of the present invention, the following effect is obtained. More specifically, when a probability that foreign/matters are held between the substrate and the plurality of support members is the same as the conventional case, it is possible to reduce a deformation of the substrate in the case where the substrate is chucked by electrostatic chucking or vacuum chucking, and thus, to prevent a flatness of the substrate from becoming worse. As a result, in a case where the substrate holding apparatus is applied to an exposure apparatus, a mask pattern can be transferred on the entire surface of the substrate at a high resolution.

In this case, it is preferable to provide a suction mechanism which sucks the substrate placed on the plurality of support members toward the base member side. By the suction, it is possible to prevent the substrate from being shifted laterally in the case where the substrate holder is moved.

Moreover, in a case where the suction mechanism is constructed as a vacuum chucking type, an example of the suction mechanism includes a ring-like closed protrusion formed on the base member so as to surround the plurality of support members, and a gas suction portion which sucks gas inside the protrusion. In the above construction, in order to reduce a probability that foreign matters are held between the protrusion and the substrate, it is preferable that the upper surface of the protrusion is provided with a plurality of projecting support members of an extremely lower step height (of a small leak) for holding the Substrate.

In these cases, it is preferable that a suction mechanism is provided which sucks the substrate placed on the plurality of support members toward the base member side, and the plurality of support members are disposed like a lattice of equilateral triangles each having one side with a length "a" [m], and when a suction force per unit length is set as "p" [N/m] in the case of sucking the substrate toward the base member side, an allowable deformation amount is set as "δmax" [m] in the case of sucking the substrate, Young's modulus E of the substrate is set as E [Pa], and a thickness of the substrate is set as "t" [m], the length "a" of the equilateral triangle and the suction force "p" satisfy the following condition (1).

$$p \cdot a^4 \leq 18 \cdot E \cdot t^3 \cdot \delta\max \tag{1}$$

By satisfying this condition, it is possible to suppress the deformation of the substrate due to the suction equal to or less than the allowable deformation amount of "δmax".

Next, according to a second aspect of the present invention, there is provided a substrate holding apparatus which holds a flat-like substrate, comprising:

a base member; and a plurality of projecting support members disposed on the base member such that distal end portions thereof are positioned on substantially the same plane, wherein a conductive material is coated on a predetermined area including a contact surface of the support member with the substrate, and an area which is not coated with the conductive material is partially formed in the predetermined area. It is preferable that the area is formed into a shape of slit.

According to the substrate holding apparatus according to the second aspect of the present invention, the area which is not coated with the conductive material (anti-electronic charging material) is formed into the slit-like shape, for example. Thus, it is possible to prevent the conductive material from cracking and peeling off due to a difference in coefficients of thermal expansion between the material forming the base member and the support member and the conductive material. As a result, the conductive material can be coated thick to some degree, and therefore, the contact surface with the substrate can be subjected to machining after the conductive material is coated. Accordingly, it is possible to secure a excellent flatness of the contact surface with the substrate, and thus, to secure a excellent flatness of the substrate.

In this case, it is preferable that the base member and the plurality of support members are made of a non-conductive material having a low thermal expansion coefficient. This is because of reducing expansion and contraction by a change of temperature. An example of the conductive material is titanium nitride or titanium carbide.

According to a third aspect of the present invention, there is provided a substrate holding apparatus which holds a flat-like substrate, comprising:

a base member having a plurality of projecting support members, distal end portions thereof which are to contact the substrate being positioned on substantially the same plane, the base member having a coating on a surface thereof except for a part of a mounting surface for the substrate, and the part being different from a contact surface with the substrate, and a suction mechanism which is connected to the base member and which sucks gas between the substrate and the base member.

Next, according to a fourth aspect of the present invention provides a substrate holding apparatus which holds a flat-like substrate, comprising:

a base member;

a plurality of projecting support members which are disposed on the base member such that distal end portions thereof are positioned on substantially the same plane, a ring-like closed protrusion formed on the based member so as to surround the plurality of support members; and a gas suction portion which sucks gas inside the protrusion, wherein a suction force after the substrate is placed on the plurality of support members is set weaker than a suction force when the substrate is placed on the plurality of support members.

According to the substrate holding apparatus according to the fourth aspect of the present invention, the suction force in the chucking start operation when the substrate is placed on the plurality of support members is set larger than the suction force after the substrate is placed (e.g., processing such as exposure or the like). Therefore, it is possible to shorten a time until a desired chucking force is obtained from the chucking start, and to improve a throughput of exposure process in the case where the substrate holding apparatus is applied to an exposure apparatus. Moreover, the suction force in processing is set to a degree such that no positional shift of substrate is generated; therefore, it is possible to reduce a deformation of the substrate by chucking to the minimum.

In this case, when the substrate is taken off from the plurality of support members, it is preferable to provide an air supply portion which blows gas into the inside of the ring-like projected portion. By doing so, the chucking release operation of the substrate can be carried out at a higher speed.

Further, according to a fifth aspect of the present invention, there is provided an exposure apparatus which exposes a second object with an exposure beam via a first object, and which includes the substrate holding apparatus according to any one of the first to third aspects of the present invention, wherein the substrate holding apparatus holds the second object as the substrate. According to the fifth aspect of the present invention, because it includes the substrate holding apparatus according any one of the first to third aspects of the present invention, it is possible to secure an excellent flatness of the substrate without reducing the chucking force for the substrate, and to manufacture a high function device at a high throughput.

According to the sixth aspect of the present invention, there is provided an exposure apparatus which illuminates a first object with an exposure beam, and exposes a second object by the exposure beam via the first object, comprising:
  a holder having a plurality of projecting support members disposed like a triangular lattice such that distal end portions thereof which are to contact the second object are positioned on substantially the same plane, and
  a stage system including a movable body in which the holder is provided.

According to a seventh aspect of the present invention, there is provided an exposure apparatus which illuminates a first object with an exposure beam, and exposes a second object with the exposure beam via the first object, comprising:
  a holder having a plurality of projecting support members with distal end portions thereof which are to contact the second object are positioned on substantially the same plane, the holder being coated on a surface thereof except for-a part of a mounting surface for the second object and the part being different from a contact surface with the second object, and
  a stage system including a movable body in which the holder is provided.

According to an eighth aspect of the present invention, there is provided an exposure apparatus which illuminates a first object with an exposure beam, and exposes a second object by the exposure beam via the first object, comprising:
  a holder having a plurality of projecting support members with distal end portions thereof which are to contact the second object being positioned on substantially the same plane, and
  a suction mechanism which is connected to the holder and which sets a suction force after the second object is placed to be weaker than a suction force when the second object is placed on the plurality of support members.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

One example of one embodiment of the present invention will be described below with reference to the accompanying drawings. According to this embodiment, the present invention is applied to a wafer holder of a projection exposure apparatus, and to an attachment mechanism thereof.

Figure 1A:
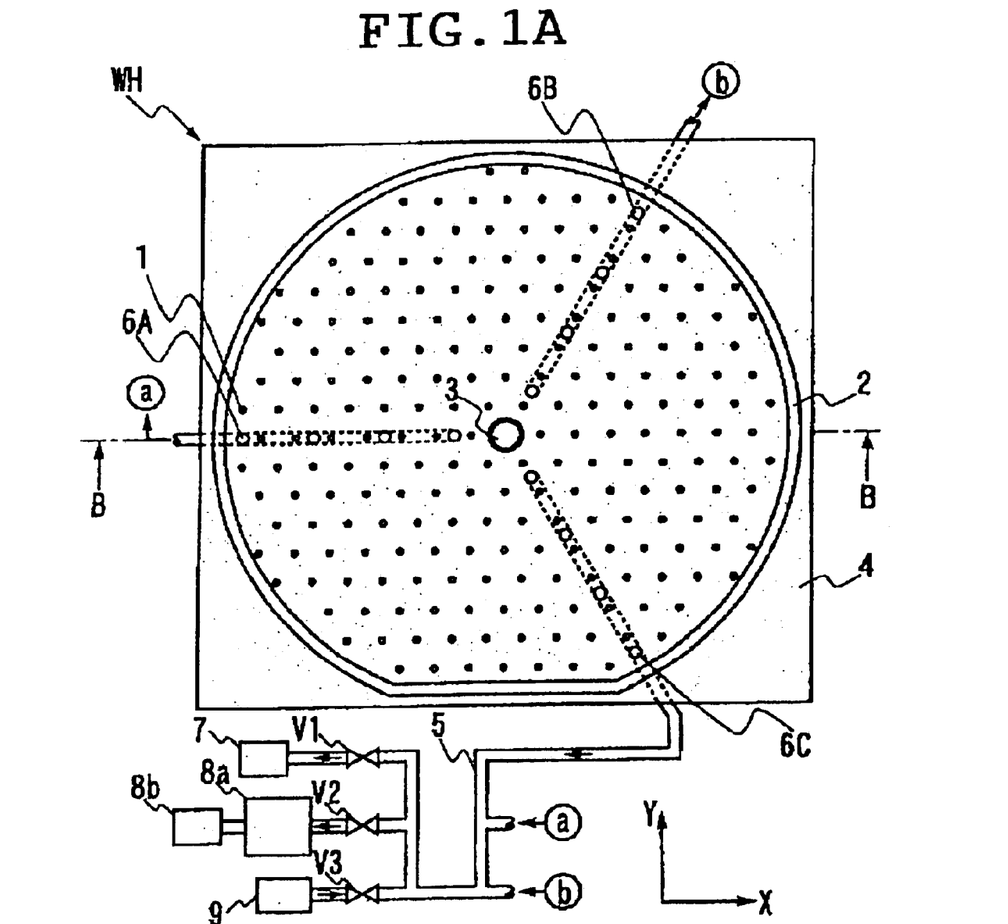
FIG. 1A is a plan view showing a wafer holder WH according to one example of one embodiment of the present invention.
Figure 1B:
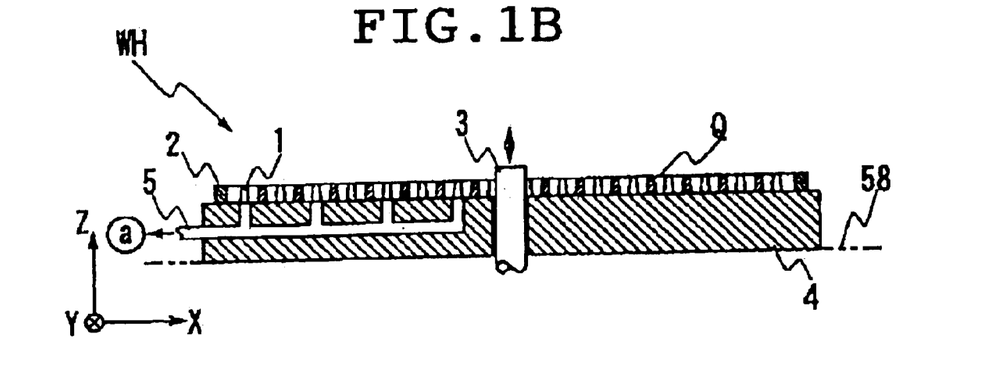
FIG. 1B is a cross sectional view along the line B—B of FIG. 1A.

FIG. 1A is a plan view showing a wafer holder WH according to the present embodiment, and FIG. 1B is a cross sectional view along the line B—B of FIG. 1A. As seen from FIG. 1A and FIG. 1B, the wafer holder WH is constructed in the following manner. More specifically, a substantially square flat-plate base member 4 is provided with a rim portion 2 on its upper surface. The rim portion 2 is made of a protrusion having a closed ring shape slightly smaller than a profile of wafer which is to be used as a holding object. Further, in an area surrounded by the rim portion 2, a large number of pins 1 are arranged like a lattice of equilateral triangles. The base member 4 is formed of ceramics having a low coefficient of thermal expansion, for example. The upper surface of the base member is etched, and thereby, the large number of pins 1 and the rim portion 2 are formed. In this case, the large number of pins 1 and the rim portion 2 may be manufactured independently from each other, and thereafter, may be individually bonded onto the base member 4 by using a bonding agent or the like. Furthermore, the shape of the base member 4 is not limited to substantially square, and a substantially circular shape may also be used.

The large number of pins 1 and the rim portion 2 are correspondent to a plurality of protecting support members and a ring-like closed protrusion of the present invention, respectively. Distal end portions of the large number of pins 1 and distal end portions of the rim portion 2 are positioned on the same plane Q. In this case, the rim portion 2 has an inner diameter (i.e., inner face profile) smaller than the profile of wafer which is to be a holding object, and may have an outer diameter (i.e., outer face profile) larger than the profile of wafer. Beside, in this embodiment, because the wafer has an orientation flat as an external shape standard used for its pre-alignment, a part of a ring-like rim portion 2 in FIG. 1A is linear. Instead of the orientation flat, however, a notch may also be used as an external shape standard. In this case, the rim portion 2 is substantially circular shape. Hereinafter, the wafer holder of this embodiment will be described taking a Z-axis vertical to the above plane Q, and using an orthogonal coordinate in a plane (plane parallel to the paper face of FIG. 1A) vertical to the Z-axis as X-axis and Y-axis.

First, as shown in FIG. 1B, the wafer holder WH of this embodiment is used in a state of being fixed on a sample holder 58, shown by a two-dotted chain line, of a wafer stage of a projection exposure apparatus. The wafer, which is an exposing object, is placed such that the bottom surface of the wafer is positioned at the position of the plane Q contacting the distal end portions of the large number of pins 1 and the distal end portions of the rim portion 2. In this case, the base member 4 is formed with a through hole at its central portion, and a center pin 3 is arranged so as to be vertically movable along the Z-axis direction via the through hole from the inside of the sample holder 58. The center pin 3 is vertically moved up or down, and thereby, the transferring in (loading) and transferring out (unloading) of the wafer are respectively carried out. In this case, the center pin 3 may be omitted, and a loading arm may be inserted under the bottom surface of the outer peripheral portion of the wafer projected outside the rim portion 2, and thereafter, the arm may be vertically moved up and down so that the wafer can be removable from and placed on the wafer holder. In the case when an outer diameter of the rim portion 2 is approximately equal to or slightly smaller than the profile (outside diameter) of the wafer, for example, a part of the rim portion 2 may be concaved so that the loading arm can be vertically movable.

Moreover, as shown in FIG. 1A, the base member 4 is formed with a series of intake and exhaust ports 6A, 6B and 6C. These intake and exhaust ports 6A, 6B and 6C are arranged around the position of the center pin 3 at substantially equal angular interval in three directions so as not to mechanically interfere with the pins 1. Further, these intake and exhaust ports 6A, 6B and 6C communicate with an outside intake and exhaust pipe 5 via a vent hole in the inside of the base member 4. Further a vacuum pump 7, a vacuum chamber 8a, a vacuum pump 8b, and an air supply equipment 9 are provided outside the wafer holder WH. More specifically, the vacuum pump 7 is used for chucking the wafer in vacuum by a predetermined chucking force, and the vacuum chamber 8a is used to chuck the wafer at a high speed. Further, the vacuum pump 8b is used for exhausting the inside of the vacuum chamber 8a, and the air supply equipment 9 is used in the case of taking off (unloading) the wafer from the wafer holder WH. The vacuum pump 7, the vacuum chamber 8a and the air supply equipment 9 are connected to the intake and exhaust pipe 5 via electro-magnetically switch valves V1, V2 and V3, respectively. Further, a pressure gauge (not shown) is connected in order to measure an internal pressure of the intake and exhaust pipe 5, and a measured value of the internal pressure by the pressure gauge is given to a control system (not shown). Based on the measured pressure and control information for wafer loading or unloading, the control system controls the opening and closing of these valves V1 to V3 and each operation of the wafer holder WH, the vacuum pumps 7 and 8a, and the air supply equipment 9. A wafer holding system comprising the wafer holder WH, the vacuum pumps 7 and 8b, the vacuum chamber 8a, the air supply equipment 9, the intake and exhaust pipe 5, valves V1 to V3 and the control system (not shown), corresponds to the substrate holding apparatus of the present invention.

Basically, in the case of loading the wafer, the center pin 3 is vertically move down in a state that the valves V1 to V3 are closed, and then, the wafer is placed on the large number of pins 1 and the rim portion 2. Thereafter, the valve V1 is opened so as to operate the vacuum pump 7, and thereby, the wafer is held by a predetermined vacuum chucking force. On the other hand, in the case of unloading the wafer, the operation of vacuum pump 7 is stopped, and then, the valve V1 is closed. Thereafter, to give one example, the valve V3 is opened so that the gas having the same pressure as the atmospheric pressure is guided into the inside of the rim portion 2, and then, the center pin 3 is moved up at the point of time when the pressure measured by the above pressure gauge reaches approximately the atmospheric pressure (approximately 1 atmosphere). The use of vacuum chamber 8a and the air supply equipment 9 will be described later.

Now, the base member 4 of the wafer holder WH of this embodiment is provided with the large number of pins 1, and these pins 1 are arranged like a lattice of equilateral triangles. More specifically, these large number of pins 1 are disposed at each lattice point of periodic lattice obtained in the following manner that an equilateral triangle and an equilateral triangle rotated (inverted) at an angle of 180° are alternatively closely arranged in the X-axis direction and in the Y-axis direction. The following is an explanation about the reason of employing the above arrangement.

Figure 2:
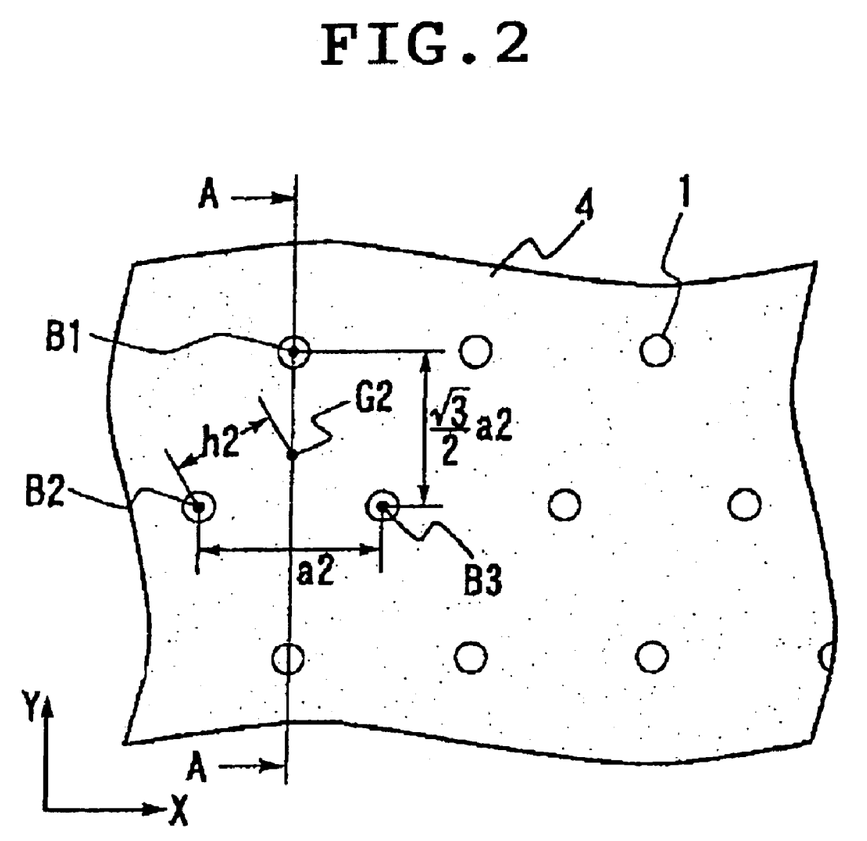
FIG. 2 is an enlarged view showing a part of an area where a large number of pins 1 on a base member 4 in FIG. 1A are arranged.

FIG. 2 is an enlarged view showing an area where the large number of pins 1 are arranged on the base member 4 of the wafer holder WH according to this embodiment. In FIG. 2, these large number of pins 1 are arranged such that they are positioned at each lattice point of the lattice of the equilateral triangles each having one side of length "a2". Here, the individual centers (regarded as the center points of portion contacting with wafer) of three pins 1 positioned at each vertex of one equilateral triangle are set as point B1, B2 and B3, and an area of a contact portion contacting the wafer including these point B1 to B3 is set as "A". In this case, each of these points B1 to B3 is used in common as each vertex of six equilateral triangles adjacent to each other. Therefore, in an area of the equilateral triangle using the points B1 to B3 as vertexes thereof, a contact ratio "ρ2" of the wafer with the pins 1 is expressed by the following equation (2). In the following equation (2), "√y" means the square roots of "y".

$$\rho2=(3 \cdot A/6)/\{a2 \cdot (\sqrt{3}/2) \cdot a2/2\}=(2/\sqrt{3})(A/a2^2) \tag{2}$$

Figure 8:
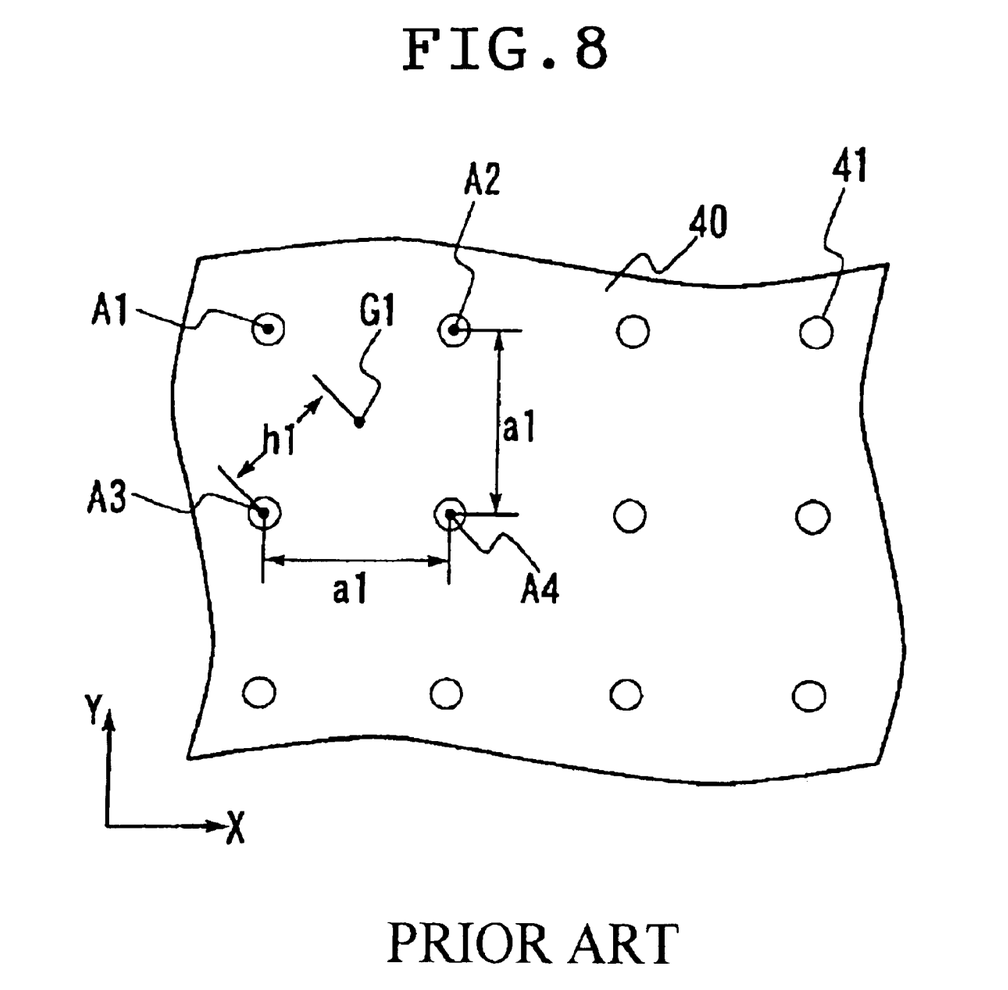
FIG. 8 is a view showing an area where a large number of pins 41 on a conventional wafer holder are arranged.

Meanwhile, FIG. 8 shows one example of pin arrangement in a conventional wafer holder. In the conventional wafer holder shown in FIG. 8, a large number of pins 41 supporting wafer on a base member 40 are arranged in a manner that they are positioned at each lattice point of a lattice of squares each having one side of length "a1". Here, the individual centers (the center points of portion contacting the wafer) of four pins 41 positioned at each vertex of one square are set as point A1 to A4, and an area of a contact portion contacting the wafer including these point A1 to A4 is set as "A" which is the same as that of the arrangement of FIG. 2. In this case, each of these points A1 to A4 is used in common as each vertex of four squares adjacent to each other. Therefore, in an area of the square using the points A1 to A4 as vertexes thereof, a contact ratio "ρ1" of the wafer with the pins 41 is expressed by the following equation (3).

$$\rho1=(4 \cdot A/4)/a1^2=A/a1^2 \tag{3}$$

Subsequently, consideration is given to the following case where the contact ratio "ρ1" in the square lattice arrangement shown in FIG. 8 is equal to the contact ratio "ρ2" in the equilateral triangle lattice arrangement shown in FIG. 2.

When the above equations (2) and (3) are set as being equal, the length "ρ2" of one side of the equilateral triangle is expressed by the following equation (4) using the length "a1" of one side of the square.

$$a2^2 = (2/\sqrt{3})a1^2 \tag{4}$$

Moreover, the more position separates from the center of the pins 1 and 41, the more wafer deformation amount by vacuum chucking increases. The deformation becomes the maximum at each position of the center of gravity G1 of the square area shown in FIG. 8 and the center of gravity G2 of the equilateral triangle shown in FIG. 2. A distance h2 from the center of gravity G2 of FI. 2 to the center of the nearest pin-i and a distance h1 from the center of gravity G1 of FIG. 8 to the center of the nearest pin 41 are expressed by the following equations (5) and (6), respectively.

$$h2 = (1/\sqrt{3})a2 \tag{5}$$

$$h1 = (1/\sqrt{2})a1 \tag{6}$$

Thus, from the above equations (4) to (6), these distances h2 and h1 have the following relation (7).

$$h1^2/h2^2 = (3\sqrt{3})/4 > 1,$$

$$h1/h2 > 1 \tag{7}$$

The above equation (7) means the relation of h1>h2. Therefore, in the case where the contact ratio "ρ1" and "ρ2" are equal, it is possible to more densely arrange the pins in the equilateral triangle lattice arrangement as compared with the square lattice arrangement, and a distance from the center of the pin to the center of gravity position where the wafer deformation becomes maximum is shortened. As a result, it is possible to make small the wafer deformation by vacuum chucking. Namely, in this embodiment, in the case where the contact ratio with wafer is set as being equal to the conventional case (a probability that foreign matters are held between the wafer and wafer holder is set as being equal), the pins 1 are arranged so as to form the equilateral triangle lattice in order for the wafer deformation amount by vacuum chucking to become smaller than the conventional case.

Next, a method for determining an arrangement interval of pins 1 will be described below with reference to FIG. 3A, FIG. 3B and FIG. 4.

Figure 3A:
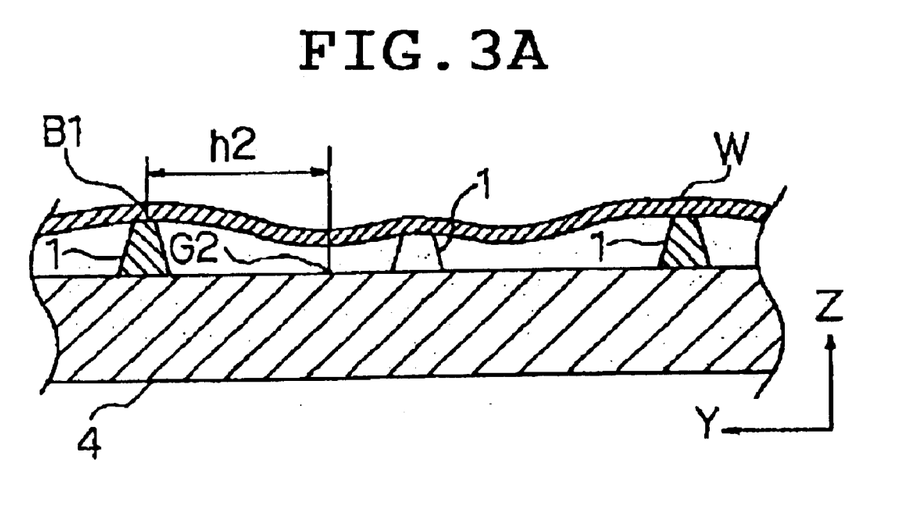
FIG. 3A is a cross sectional view along the line A—A of FIG. 2.
Figure 3B:
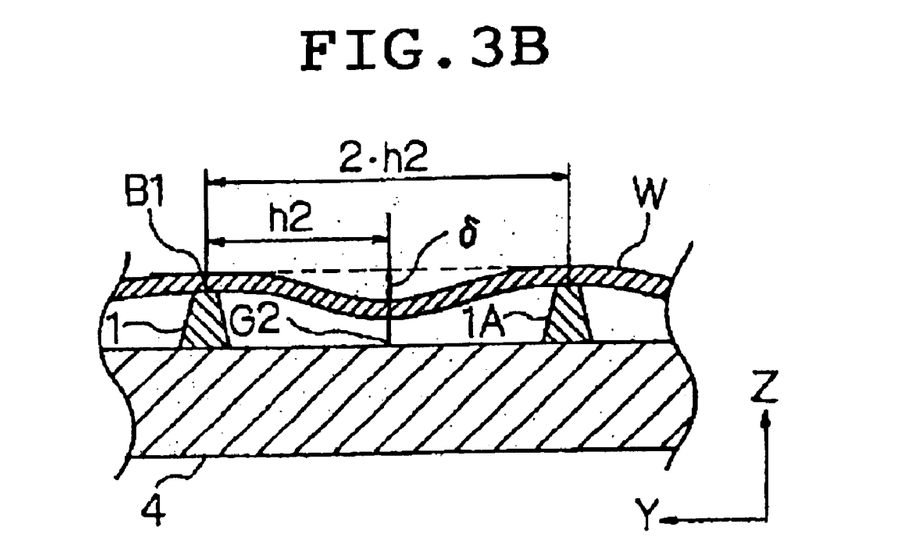
FIG. 3B is a cross sectional view showing the case where an imaginary pin 1A is arranged.

FIG. 3A is a cross section view along the line A—A of FIG. 2 in the case where the wafer is chucked in vacuum in a state of being placed on the large number of pins 1 shown in FIG. 2. As exageratingly shown in FIG. 3A, the wafer W placed on the pins 1 is deformed mainly by a chucking force. Moreover, in FIG. 3A, there is shown the center of gravity G2 of FIG. 2 as a point having a distance "h2" from the point B1. In this embodiment, first, a deformation amount of the wafer W is obtained from an approximate calculation as a both ends supporting beam having a length 2·h2, to which a uniformally distributing load is applied. For this purposre, as shown in FIG. 3B, a pin 1A is imaginarily arranged on a position symmetrical of the center of gravity G2 with respect to the point B1, and the wafer W is regarded as a both ends supporting beam having a length 2·h2 between the pin 1 at the point B1 and the pin 1A. Then, by the approximate calculation, a deformation amount (maximum deformation amount δ) at the center of gravity G2 of the both ends supporting beam is calculated. The maximum deformation amount δ is expressed by the following known equation (8) assuming that a weight per unit length applied to the both ends supporting beam is set as "w" [N/m], the length of the both ends supporting beam is set as "h" [m], Young's modulus of the wafer W is set as "E" [Pa], and a cross-sectional secondary moment is set as "I" [m$^4$].

$$\delta = w \cdot h^4 / (384 E \cdot I) \tag{8}$$

In this case, the cross-sectional secondary moment I is expressed by the following equation (9) assuming that a width of the both ends supporting beam is set as "b", and a thickness thereof is set as "t".

$$I = (1/12) b \cdot t^3 \tag{9}$$

Further, the length h of the both ends supporting beam is expressed by the following equation (10) from the above equation (6).

$$h = 2 \cdot h2 = (2/\sqrt{3}) a2 \tag{10}$$

Further, the weight w per unit length applied to the both ends supporting beam is a suction pressure "p" [N/m] per unit length when chucking the wafer W in vacuum. Thus, if the width "b" of the both ends supporting beam is set as unit length (b=1), and an allowable deformation amount δ max of the wafer W is set as the maximum deformation amount δ of the both ends supporting beam, the above equation (8) is transformed into the following equation (11).

$$\delta\text{max} = \delta = p(2 \cdot a2/\sqrt{3})^4 / (32 E \cdot t^3) = p \cdot a2^4 / (18 E \cdot t^3) \tag{11}$$

The allowable deformation amount δmax is, for one example, about ½ of the width of the depth focus of the projection optical system of projection exposure apparatus. Further, when the above equation (11) is transformed, in order to set the maximum deformation amount of the wafer W less than the allowable deformation amount δmax, the relation between the arrangement interval "a2" of the pins 1 and a suction pressure p (chucking force) is expressed by the following equation (12).

$$p \cdot a2^4 < 18 E \cdot t^3 \cdot \delta\text{max} \tag{12}$$

For example, in the case of vacuum-chucking a SEMI standards 8-inch wafer (diameter=about 200 mm, t=0.725 mm, Young's modulus E=110.7×10$^9$ Pa) under the condition of suction pressure p=−78×10$^3$ N/m (=−600 mmHg), and when it is desired that the wafer deformation amount is reduced to 4 nm (δmax=4 nm) or less in the light of the depth of focus or the like. A range of the arrangement interval "a2" of the pins 1 is calculated as shown in the following equation (13) from the above equation (12). Here the calculation is made using an absolute valve of the suction pressure "p".

$$78 \times 10^3 \times a2^4 \leq 18 \times 110.7 \times 10^9 \times (0.725 \times 10^{-3})^3 \times 4 \times 10^{-9},$$

$$a2^4 \leq 3.894 \times 10^{-11},$$

$$a2 \leq 2.50 \times 10^{-3} \, [m] \tag{13}$$

Therefore, in the case where the allowable deformation amount δmax of the wafer W is 4 nm, the arrangement interval "a2" of the pins 1 may be set to 2.50 mm or less.

Figure 4:
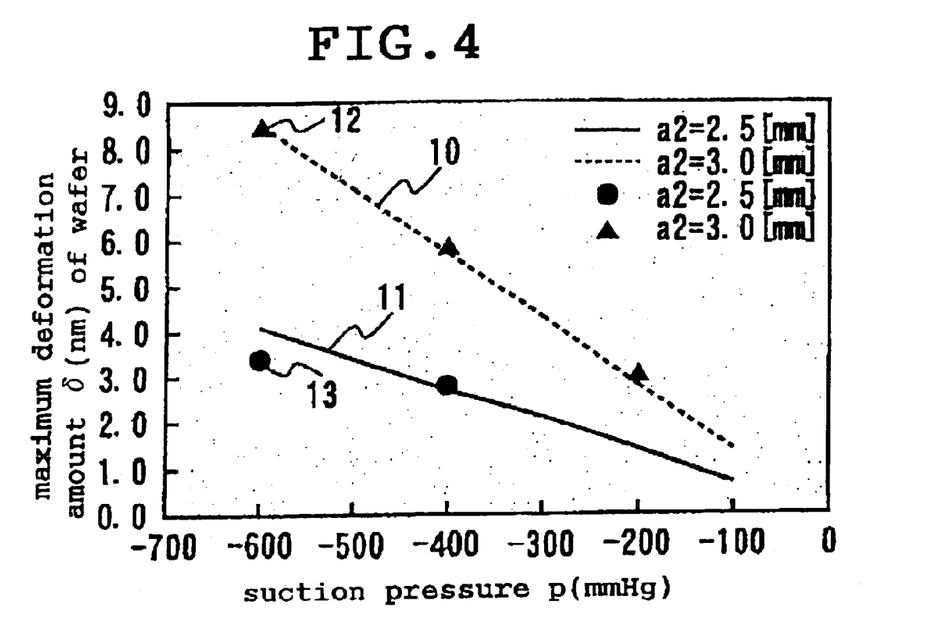
FIG. 4 is a chart showing a comparison between a wafer deformation calculated by an approximate expression of the one embodiment and a wafer deformation calculated by a finite element method.

FIG. 4 is a chart showing a comparison between the maximum deformation amount of the 8-inch wafer obtained from the above equation (11) and the maximum deformation amount of wafer obtained from a finite element method, in the case where the arrangement interval a2 of the pins 1 is varied. In the chart shown in FIG. 4, the ordinate shows a maximum deformation amount δ[nm] of the wafer; on the other hand, the abscissa shows a suction pressure "p" (in this case, the unit is expressed by mmHg). Moreover, a solid line 11 and a dotted line 10 represent the relations between a wafer deformation amount δ obtained from the equation (11) and a suction pressure "p" in the cases where the arrangement interval "a2" of the pin 1 is set to 2.5 mm and 3.0 mm, respectively. A black round mark 13 and a black triangular mark 12 show the relations between a wafer deformation amount δ obtained from the finite element method and a suction pressure "p" in the cases where the arrangement interval "a2" of the pins 1 is set to 2.5 mm and 3.0 mm, respectively. In the following Table 1, there are shown numerical value data of FIG. 4.

TABLE 1

| suction pressure (mmHg) | maximum deformation amount δ (nm) of wafer | | | |
|---|---|---|---|---|
| | approximate expression of the present embodiment | | finite element method | |
| | a2 = 2.5 mm | a2 = 3.0 mm | a2 = 2.5 mm | a2 = 3.0 mm |
| −100 | 0.7 | 1.4 | | |
| −200 | 1.4 | 2.8 | | 3 |
| −300 | 2.1 | 4.3 | | |
| −400 | 2.7 | 5.7 | 2.8 | 5.8 |
| −500 | 3.4 | 7.1 | | |
| −600 | 4.1 | 8.5 | 3.4 | 8.4 |

From FIG. 4 and the above Table 1, it can be seen that the result obtained from the equation (11) and the result obtained from the finite element method become approximately similar value, and therefore, the above equation (11) can be effectively used.

Moreover, under the same condition as above, in the case of vacuum-chucking a SEMI standards 12-inch wafer (diameter=about 300 mm, t=0,775 mm, Young's modulus E is the same as the above 8-inch wafer), from the equation (12), it can be seen that the arrangement interval of pins 1 is set to 2.63 mm or less. Further, in the 12-inch wafer, the arrangement interval a2 of pins 1 is set to the following range (14), and thereby, when the allowable deformation amount δmax of wafer is set to practical several nm or less, a substantially required suction pressure "p" (chucking force) can be obtained.)

$$1\ mm < a2 < 3\ mm \quad (14)$$

In the above embodiment, the pins 1 have been arranged like an equilateral triangle lattice. These pins 1 are not always arranged like an accurately equilateral triangle lattice, and a change in the arrangement may be allowable so long as it is a normal error in machining. Moreover, in the case where the wafer holder WH of FIG. 1 is applied to a step and exposure type exposure apparatus, when a wafer scanning direction is set as a Y-axis direction, an exposure area (an illumination area of an exposure light IL, which will be explained later) on the wafer is formed into a shape of thin and long slit extending along a non-scanning direction (X-axis direction). In order to improve a flatness of wafer in the non-scanning direction more than the same in the scanning direction, the pins 1 may be arranged in the following manner. More specifically, these pins 1 are arranged like an isosceles triangle having the base parallel with the X-axis, and other two sides longer than the base and equal to each other. In addition, these pins 1 are arranged like a triangular lattice. Viewing the triangle lattice from a different angle, it is a matter of course that the pins 1 are arranged like a parallelogram (or rhombus) lattice.

In the embodiment of FIG. 1, the upper surface of the rim portion is flat; for this reason, there is a possibility that foreign matters such as resist residual dregs are held between the upper surface of the rim portion 2 and the wafer placed thereon. In order to reduce the above possibility that foreign matters are held between the rim portion 2 and the wafer, the rim portion 2 may be formed with a plurality of pins (projecting support members) same as the pins 1 at its upper surface. In this case, a height of the rim portion 2 is adjusted so that the upper end portions of the above pins on the rim portion 2 is flushed with the identical plane Q together with the upper end portions of the pins 1 on the base member 4. In order to reduce a leak of gas from between the pins on the rim portion 2 during the vacuum-chucking of the wafer, a height (depth) of the pins 1 on the base member 4 is set to a range from about 200 to 300 μm, for example. In this case, a height of the pins on the rim portion 2 is set extremely smaller; more specifically, set to about 10 μm (about 1/20 to 1/30). The plurality of pins on the rim portion may be arranged like an equilateral triangle, and besides, may be arranged like a substantially coaxial circles of plural lines along the rim portion 2.

Next, coating of an anti-electronic charging material for wafer with respect to the wafer holder WH of FIG. 1 will be described below with reference to FIG. 5.

Figure 5:
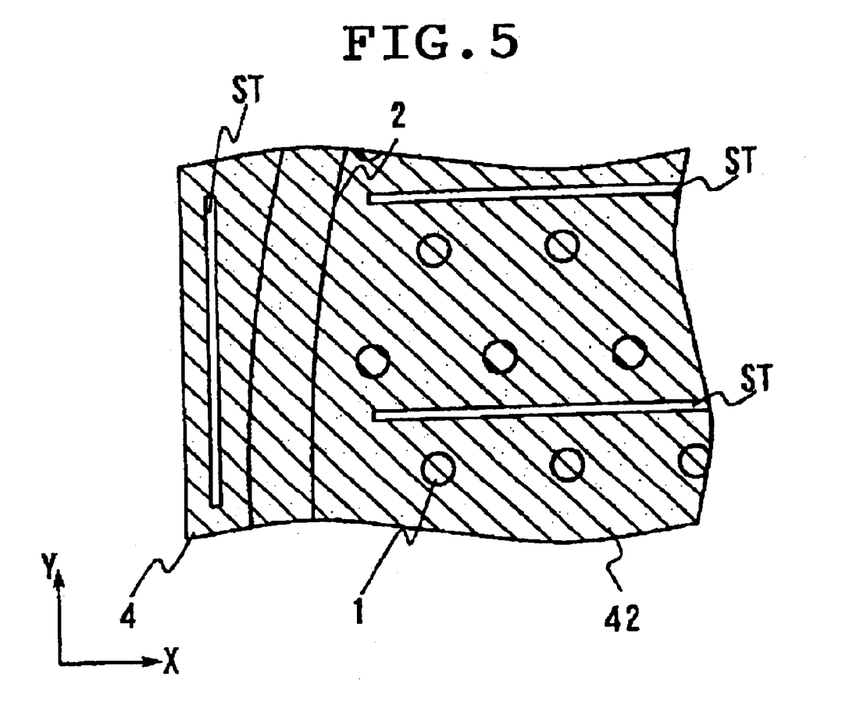
FIG. 5 is a view showing an area, which is coated with an anti-electronic charging material 42 for a wafer, in a surface of the wafer holder according to the one embodiment.

FIG. 5 is an enlarged view showing a part of the wafer holder WH of FIG. 1. As shown in FIG. 5, the surfaces of the base member 4 of the wafer holder according to the present embodiment, pin 1 and rim portion 2 are coated with a wafer anti-electronic charging material 42 made of a conductive material such as titanium nitride (TiN), titanium carbide (TiC) by vapor deposition or sputtering, etc. The anti-electronic charging material is grounded on the back side of the wafer holder. The anti-electronic charging material 42 corresponds to the conductive material of the present invention, and further, by grounding the material 42, the wafer placed on the wafer holder WH is grounded, and therefore, the wafer can be prevented from being electrically charged.

In this embodiment, the base member 4 of the wafer holder WH is provided with an area ST, which is not coated with the anti-electronic charging material 42 at a part of the surface thereof, and further, the area ST is formed into a shape of slit. By doing so, even if the base member 4 is formed of materials having allow coefficient of thermal expansion, such as fine ceramics, glass ceramics or the like, the following effect is obtained. More specifically, it is possible to prevent the anti-electronic charging material 42 from cracking and peeling off due to a difference in coefficients of thermal expansion between the anti-electronic charging material 42 coated on the surface of the base member 4 and a material forming the base member 4. Therefore, the anti-electronic charging material 42 can be coated thick to some degree, and after the anti-electronic charging material 42 is coated, the contact surfaces of the large umber of pins 1 with the wafer and the rim portion 2 can be subjected to polishing so that a flatness of the contact surfaces can be improved. As a result, it is possible to preferably secure a degree of plane (flatness) of the wafer chucked and held.

In this case, the shape of the area ST, which is not coated with the anti-electronic charging material, is not limited to the above slit. Further, the technique of preventing a crack and the like of the anti-electronic charging material coated as shown in FIG. 5 is applicable to the following wafer holders in the same or similar manner. The wafer holders include the wafer holder having pins arranged like an equilateral triangle as shown in FIG. 2, the wafer holder having a plurality of pins arranged like a square lattice, and the wafer holder having a plurality of ring-like closed protrusions arranged like coaxial circles. In this embodiment, the material 42 coating the surface of the wafer hold is not limited to the anti-electronic charging material, and, for example, materials having a hardness higher than the base member 4 and the like may also be used.

Next, the case where the wafer holder WH of FIG. 1 is applied to an projection exposure apparatus will be described below with reference to FIG. 6 and FIG. 7.

Figure 6:
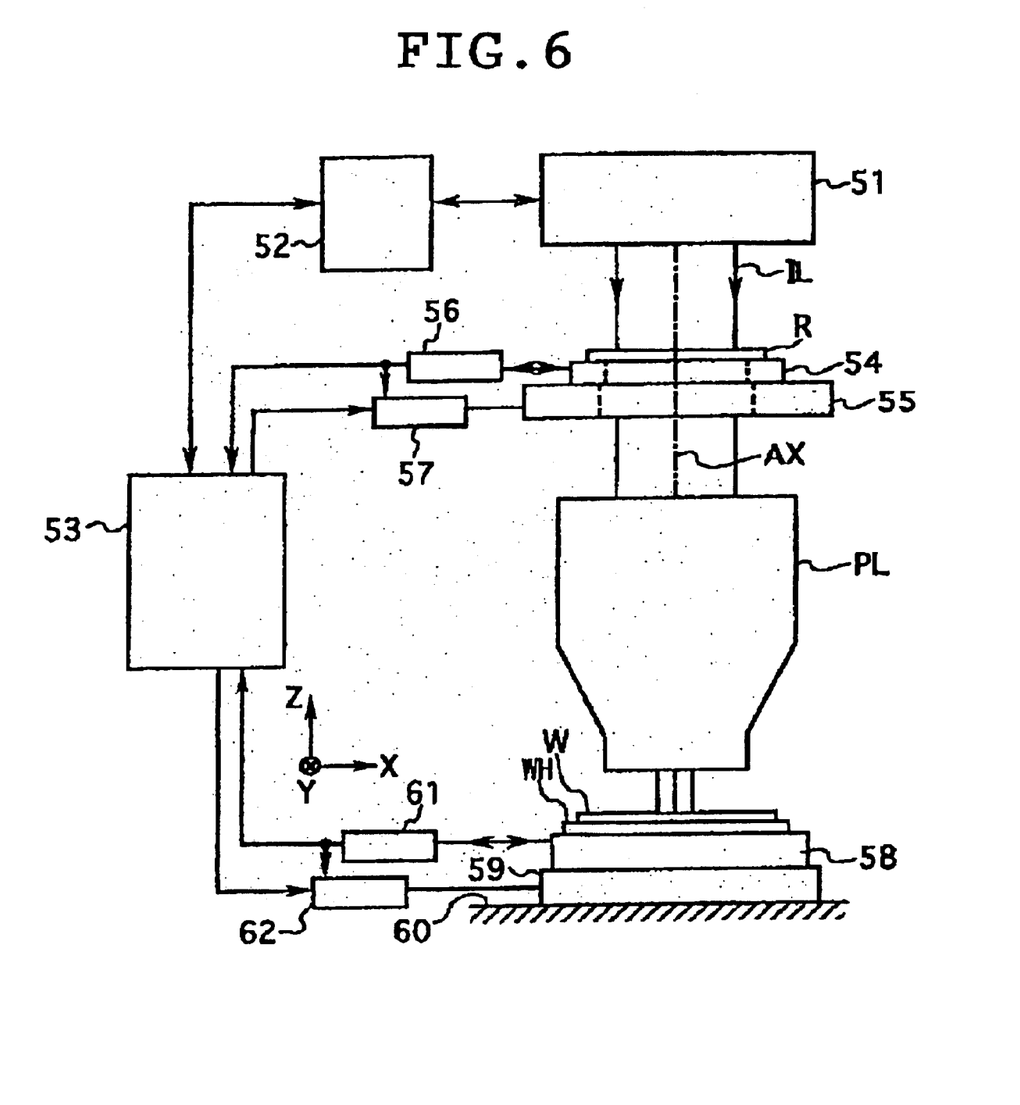
FIG. 6 is a view showing a configuration of a projection exposure apparatus including the wafer holder WH of FIG. 1 as a substrate holding apparatus.

FIG. 6 shows the projection exposure apparatus used in this embodiment. In FIG. 6, in exposure, exposure light IL used as exposure beam is irradiated to a reticle R used as a mask from an illumination optical system 51. The illumination optical system 51 comprises an exposure light source such as a mercury lamp, an excimer laser light source or the like, an optical integrator, a variable field stop, a condenser lens and the like. Then, a pattern image formed on the reticle R is projected on one shot area on the wafer W as a substrate, on which a photo-resist is coated at a magnification $\alpha(\alpha$ is $\frac{1}{5}$, $\frac{1}{4}$, etc.) via a projection optical system PL. The reticle R and the wafer W are regarded as a first object and a second object, respectively. In this case, an exposure control system 52 controls an exposure amount on the basis of control information from a main control system 53. Hereinafter, the description will be made taking a Z-axis in parallel with an optical axis AX of the projection optical system PL, an X-axis parallel with the paper surface of FIG. 6 in the plane perpendicular to the Z-axis, and a Y-axis perpendicular to the paper surface of FIG. 6.

In this case, the reticle R is chucked and held on a reticle stage 54. Then, the reticle stage 54 positions the reticle R on a reticle base 55 in the X-axis, Y-axis and rotating directions according to the control information from a drive system 57 based on a coordinate measured value of the reticle stage 54 by a laser interferometer 56.

On the other hand, the wafer W is held on the wafer holder WH by vacuum chucking, and the wafer holder WH is fixed on a sample holder (Z leveling stage) 58. The sample stage 58 is fixed on an X-Y stage 59 supported so as to float on a surface plate via an air bearing. The sample holder 58 controls a Z-axis direction position (focus position) and an inclined angle of the wafer W so that the surface of wafer W is aligned with an image plane of the projection optical system PL according to an auto-focus method. On the other hand, the X-Y stage 59 stepwise moves the sample holder 58 in the X-axis and Y-axis directions according to the control information for the drive system 62 based on the position of the sample holder 58 measured by the laser interferometer 61. The step movement by the X-Y stage 59 and the exposure of the wafer with the exposure light from the reticle R are repeated according to a step-and-repeat method, and thereby, the transfer of the pattern image of the reticle R to each shot area on the wafer W is carried out.

Next, the following is a description on an operation for loading the wafer W on the wafer holder WH and an operation for unloading the wafer W from the wafer holder WH. The operation will be described below with reference to a flowchart shown in FIG. 7.

Figure 7:
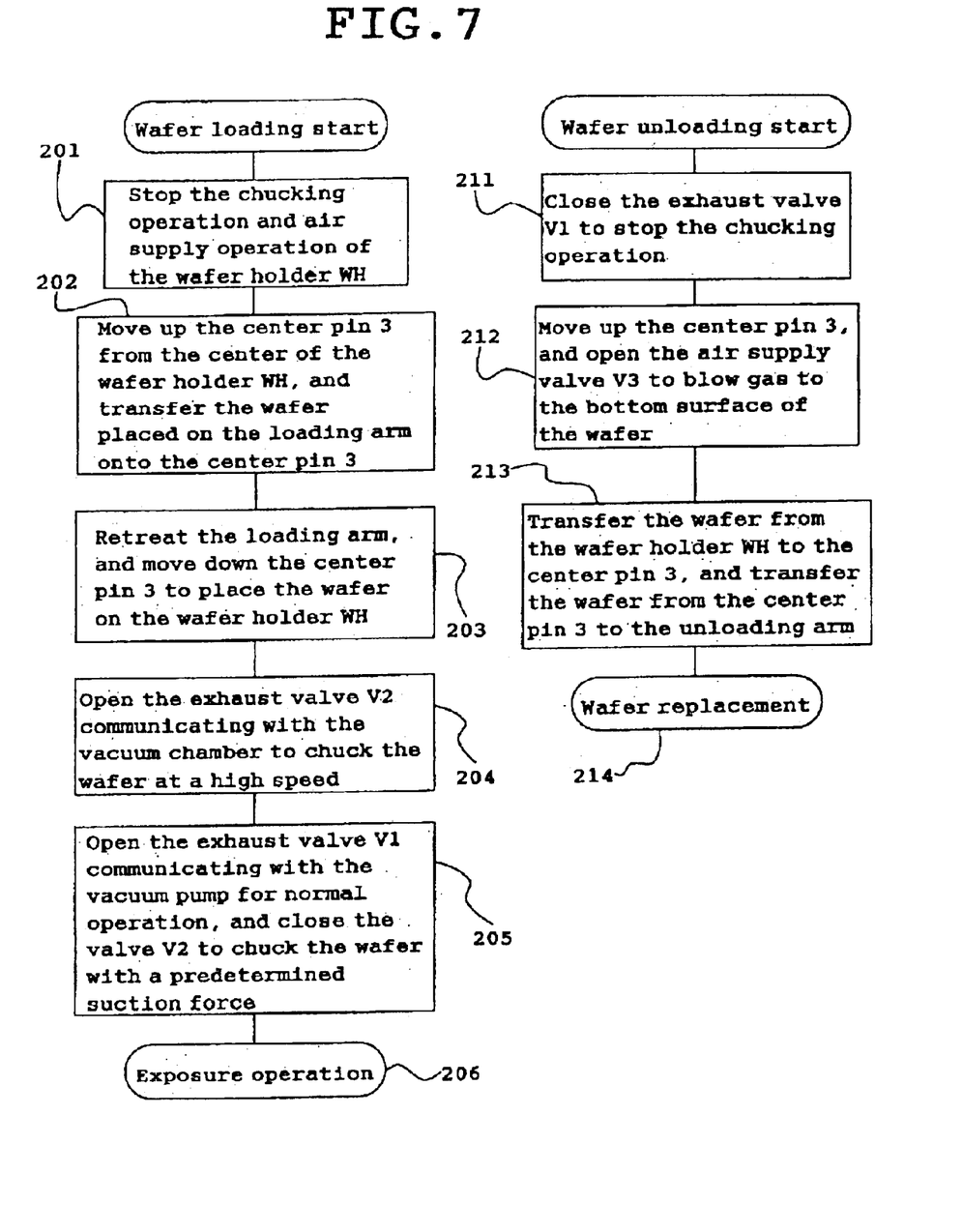
FIG. 7 is a flowchart showing each operation in the case of placing a wafer onto the wafer holder WH and taking off the wafer from the wafer holder WH.

In the case of loading the wafer W on the wafer holder WH, first, in step 201 of FIG. 7, the valves V1 to V3 of FIG. 1A are all closed so that a chucking operation and an air supply operation by the wafer holder WH is stopped. Next, in step 202, the center pin 3 of the wafer holder WH is vertically moved up, and then, the wafer W on the load arm (not shown) is transferred onto the center pin 3. Thereafter, in step 203, the load arm is retreated, and then, the center pin 3 is moved down so that the wafer W is placed on the wafer holder WH. Subsequently, in step 204, the valve V2 communicating with the vacuum chamber 8a for high-speed exhaust shown in FIG. 1A is opened so that the gas in a space surrounded by the base member 4, the rim portion 2 and the wafer W is exhausted (sucked at a high speed). In this case, in this embodiment, in order to improve a throughput, the vacuum chamber 8a is used,/and thereby, a suction pressure is increased to about −600 mmHg, for example.

After the wafer W is chucked at a high speed, in step 205, the valve V2 of FIG. 1A is closed and the exhaust valve V1 communicating with the vacuum pump 7 for normal operation is opened, and then, the wafer W is chucked by a suction force of the vacuum pump 7, and thus, the control sequence transfers to an exposure operation of step 206. Moreover, after the wafer W is placed and before the wafer W is unloaded from the wafer holder WH, a suction pressure (chucking force) may be supplied to such an extent that an adverse effect is given to a pre-alignment accuracy and the like when the wafer W is shifted laterally by the movement of wafer stage, and therefore, the suction pressure is not required so high. In view of this, in this embodiment, in order to reduce a deformation of the wafer W by the vacuum chucking to the minimum, the suction pressure by the vacuum pump 7 for normal operation is set low, for example, to a range from about −200 to −250 mmHg.

As described above, the suction pressure is different between the case of loading the wafer on the wafer holder WH and the case of making the operations other than the wafer loading. By doing so, it is possible to shorten a time to load the wafer on the wafer holder WH, and thus, to improve a throughput of the exposure process while reducing a deformation of the wafer by vacuum chucking to the minimum.

Next, in the case of unloading the wafer W from the wafer holder WH, first, in step 211 of FIG. 7, the exhaust valve V1 of FIG. 1A is closed so that the chucking operation is stopped. Then, in step 212, the center pin 3 is vertically moved up, and the air supply valve V3 is opened so that a gas is blown to the bottom surface of the wafer W. In step 213, the wafer W is transferred from the wafer holder WH to the center pin 3, and then, is transferred from the center pin 3 to the unload arm (not shown), and thereafter, in step 214, a wafer exchange (replacement) is carried out.

As described above, in the case of unloading the wafer from the wafer holder WH, the gas is blown to the bottom surface of the wafer, and thereby, it is possible to shorten a wafer unload time, and thus, to improve a throughput of the exposure process. Further, it is possible to shorten an atmospheric pressure release waiting time of an alignment sensor for detecting a wafer position and the like.

In this case, likewise, the following wafer holders may be used as the wafer holder WH-for the projection exposure apparatus shown in FIG. 6. The wafer holder includes the wafer holder having pins arranged like an equilateral triangle as shown in FIG. 2, the wafer holder having a large number of pins arranged like a square lattice, and the wafer holder having a plurality of ring-like closed protrusions arranged like coaxial circles. A wafer holder having no area ST which is not coated with the material 42 shown in FIG. 5 may be used as the wafer holder WH of the projection exposure apparatus shown in FIG. 6.

In addition, in the case of using a vacuum ultraviolet ray and the like as exposure light, the gas on the optical path of the exposure light is replaced with the gas having a transmittance with respect to the exposure light such as helium or the like. In such a case, in the above step 212, it is preferable that the gas blown to the bottom surface of the wafer is a gas having a transmittance with respect to the exposure light. Moreover, in step 212, it is preferable that the gas blown to the bottom surface of the wafer is set to a trace amount such that the wafer is not floated up.

In the above embodiment, vacuum chucking has been carried for chucking the wafer to the wafer holder. Besides, the present invention may be applicable to the case where the wafer is chucked by electrostatic chucking.

The projection exposure apparatus shown in FIG. 6 is not limited to the step-and-repeat type. The projection exposure apparatus may be constructed as the following types; more specifically, a step-and-scan type, or a scanning exposure type such as a mirror projection, or a step-and-stitch type of transferring a plurality of patterns on a photosensitive substrate in a state that they are partially overlapped. Further, the present invention may be applicable to, for example, a proximity exposure apparatus using no projection optical system. Furthermore, the exposure light (exposure beam) is not limited to an ultraviolet ray. EUV (Extreme Ultraviolet) light, X-rays, and charged particle beams such as an electron beam and an ion beam may also be used as the exposure light. In case when the projection exposure apparatus of FIG. 6 is scanning exposure type, the reticule stage 54 and the XY stage 59 are synchronously driven in a speed ratio almost consistent with the magnification of the projection optical system PL, and the reticule R and wafer W are respectively moved along the scanning direction (e.g. Y direction) relative to an exposure light IL. That is, in synchronous with the movement of the reticule R relative to the illumination area illuminated with the exposure light IL by the illumination optical system 51, the wafer W is moved relative to the exposure area (projection area in which the pattern image of the reticule R is formed in conjugate with the illumination area concerning the projection optical system PL) illuminated with the exposure light IL by the projection optical system PL. By this synchronous moving, entire surface of the pattern of the reticule R is illuminated with the exposure light IL and entire surface of one shot area on the wafer W is scanned and exposed with the exposure light IL, thereby the pattern image of the reticule R is transferred onto the shot area.

Moreover, the projection exposure apparatus of the above embodiment can be manufactured in the following manner. More specifically, an illumination optical system and a projection optical system each comprising a plurality of lenses are incorporated into the exposure apparatus main body, and then, an optical adjustment is made. Further, the reticule stage and the wafer stage each comprising a large-number of mechanical parts are attached to the exposure apparatus main body, and then, wiring and piping connection are made. Furthermore, total adjustments (electric adjustment, operation confirmation, etc.) are made. In this case, it is preferable that the manufacture of the exposure apparatus is carried out in a clean room in which a temperature, cleanliness and the like are suitably controlled.

In the case of manufacturing a semiconductor device on a wafer using the projection exposure apparatus of the above embodiment, the semiconductor device is manufactured by way of the following steps. The steps include a step of making a design of the device function and performance, a Step of manufacturing a reticule based on the above step, a step of forming a wafer out of silicon material, a step of carrying out alignment by the projection exposure apparatus of the above embodiment and exposing the reticule pattern on the wafer, a device assembly step (including dicing process, bonding process, packaging process), an inspection step, etc.

Moreover, the present invention is applicable to an exposure apparatus used in the case of manufacturing display devices such as a liquid crystal display device and a plasma display device, an image pickup device (CCD), a micro machine, devices such as thin film magnetic head. Further, the present invention is also applicable to an exposure apparatus used in the case of transferring a mask and a reticule with a transfer method. Furthermore, the present invention is also applicable to various equipments (inspection equipments, etc.), other than the exposure apparatus used in a photolithography process for device manufacture. In the present invention, the substrate which is to be held by the substrate holding apparatus is not limited to a circular (disc) shape. The substrate may be a rectangular shape or the like.

The entire disclosure of Japanese Patent Application No.2000-069321 filed on Mar. 13, 2000 including specification, claims, drawings and abstract, and the entire disclosure of Japanese Patent Application No.2001-061769 filed on Mar. 6, 2001 including specification, claims, drawings and abstract are incorporated herein by reference in their entirety.

Although various exemplary embodiments have been shown and described, the invention is not limited to the embodiments shown. Therefore, the scope of the invention is intended to be limited solely by the scope of the claims that follow.

What is claimed is:

1. A substrate holding apparatus in an exposure apparatus which exposes a sensitive surface of a flat-like substrate with an exposure beam, which holds the substrate, comprising:
    a base member having a low thermal expansion coefficient;
    a protrusion formed on the base member and having a substantially same shape as an outside shape of the substrate; and
    a plurality of projecting support members disposed on said base member such that the projecting support members are arranged like a triangular lattice inside of the protrusion and distal end portions thereof are substantially positioned on a plane so as to respectively contact a different surface of the substrate from the sensitive surface, wherein
        the substrate is to be placed on said plurality of support members.

2. A substrate holding apparatus as recited in claim 1, further comprising:
    a suction mechanism which sucks the substrate placed on the plurality of support members toward said base member side.

3. A substrate holding apparatus as recited in claim 1, further comprising:
    a gas suction portion which sucks gas inside the protrusion.

4. A substrate holding apparatus as recited in claim 2, wherein
    said plurality of support members are disposed like a lattice of equilateral triangles each having one side with a length "a", and
    when a suction force per unit length is set as "p" in the case of sucking the substrate toward the base member side, an allowable deformation amount is set as "δmax" in the case of sucking the substrate, Young's modulus E of the substrate is set as E, and a thickness of the substrate is set as "t", the length "a" of the equilateral triangle and the suction force "p" satisfy the following condition:

$$p \cdot a^4 \leq 18 \cdot E \cdot t^3 \cdot \delta max.$$

5. A substrate holding apparatus as recited in claim 4, wherein
the substrate is a semiconductor substrate having a diameter of approximately 300 mm, and the one side of the equilateral triangle has a length of 1 mm–3 mm.

6. A substrate holding apparatus as recited in claim 1, wherein
said base member is coated on a surface thereof except for a part of a mounting surface for the substrate, said part being different from a contact surface with the substrate.

7. A substrate holding apparatus as recited in claim 1, further comprising:
a suction mechanism which is connected to said base member and which sets a suction force after the substrate is placed to be weaker than a suction force when the substrate is placed on said plurality of support members.

8. An exposure apparatus which exposes a second object with an exposure beam via a first object, comprising:
said substrate holding apparatus as recited in claim 1, wherein said substrate holding apparatus holds the second object as the substrate.

9. An apparatus according to claim 8, further comprising:
a suction mechanism which is connected to the base member in order for the second object to be held to the base member, wherein
when a suction force for the second object by the suction mechanism is set as "p", an allowable deformation amount of the second object in the case of sucking the second object is set as "δmax", Young's modulus E of the second object is set as E, and a thickness of the second object is set as "t", a distance "a" of two of the plurality of projecting support members disposed like the triangular lattice and the suction force "p" satisfy the following condition:

$$p \cdot a^4 \leq 18 \cdot E \cdot t^3 \cdot \delta max.$$

10. An apparatus according to claim 8, wherein
the second object is a semiconductor wafer having a diameter of approximately 300 mm, and
the interval of two projecting support members, which are disposed like a triangular lattice, of said plurality of projecting support members is set to approximately 1 mm to 3 mm.

11. An apparatus according to claim 8, wherein
a height of the protrusion is set lower than a height of said plurality of projecting support members.

12. An apparatus according to claim 11, wherein
said protrusion comprises second projecting support members different from said projecting support members, distal end portions of said second projecting support members being positioned on the same plane on which said distal end portions of said projecting support members are positioned.

13. An apparatus according to claim 1, wherein
said base member is coated on a surface thereof that contacts the substrate with a conducting material.

14. An apparatus according to claim 13, wherein
said base member is formed of a non-conducting material different from said coating layer on said surface.

15. An exposure apparatus which illuminates a first object with an exposure beam, and exposes a sensitive surface of a second object with the exposure beam via the first object, comprising:
a holder having a protrusion formed in a substantially same shape as an outside shape of the second object, and a plurality of projecting support members disposed like a triangular lattice inside of the protrusion such that distal end portions thereof positioned substantially on a plane so as to respectively contact a different surface of the substrate from the sensitive surface, the holder being formed of a material having a low thermal expansion coefficient, and
a stage system including a movable body in which said holder is provided.

16. An exposure apparatus as recited in claim 15, wherein
said stage system respectively moves the first and second objects relative to the exposure beam in order to scan and expose the second object with a beam generated from the first object by irradiation of the exposure beam.

17. An exposure apparatus as recited in claim 16, wherein
said plurality of support members are disposed like a lattice of isosceles triangles each having a base parallel with a second direction crossing a first direction along which the second object is moved at the scanning and exposure.

18. An exposure apparatus as recited in claim 17, wherein
the isosceles triangle has a height direction parallel with the first direction and has a height longer than the base.

19. An apparatus according to claim 17, wherein
a height of the protrusion is set lower than a height of said plurality of projecting support members.

20. An apparatus according to claim 19, wherein
said protrusion comprises second projecting support members different from said projecting support members, distal end portions of said second projecting support members being positioned on the plane on which said distal end portions of said projecting support members are positioned.

21. An exposure apparatus as recited in claim 16, wherein
said plurality of support members which are disposed like a lattice of parallelograms each having two sides parallel with a second direction crossing a first direction along which the second object is moved at the scanning and exposure.

22. An apparatus according to claim 21, wherein
a height of the protrusion is set lower than a height of said plurality of projecting support members.

23. An apparatus according to claim 22, wherein
said protrusion comprises second projecting support members different from said projecting support members, distal end portions of said second projecting support members being positioned on the plane on which said distal end portions of said projecting support members are positioned.

24. An exposure apparatus as recited in claim 16, wherein
said plurality of support members which are disposed like a lattice of rhombuses each having a first width with respect to a first direction along which the second object is moved and a second width with respect to a second direction crossing the first direction, the first width being larger than the second width.

25. An exposure apparatus as recited in claim 15, wherein
said holder is coated on a surface thereof except for a part of a mounting surface for the second object, said part being different from a contact surface with the second object.

26. An exposure apparatus as recited in claim 15, further comprising:
a suction mechanism which is connected to said holder and which sets a suction force after the second object is placed to be weaker than a suction force when the second object is placed on said plurality of support members.

27. An apparatus according to claim 15, wherein
said holder is coated on a surface thereof that contacts the second object with a conducting material.

28. An apparatus according to claim 27, wherein
said holder is formed of a non-conducting material different from said coating layer on said surface.

* * * * *